United States Patent [19]

Stierman et al.

[11] Patent Number: 4,979,015
[45] Date of Patent: Dec. 18, 1990

[54] INSULATED SUBSTRATE FOR FLIP-CHIP INTEGRATED CIRCUIT DEVICE

[75] Inventors: Roger J. Stierman, Richardson; K. Gail Heinen, Dallas; Thomas Ramsey, Garland; James F. Haefling, Richardson, all of Tex.

[73] Assignee: Texas Instruments Incorporated, Dallas, Tex.

[21] Appl. No.: 246,130

[22] Filed: Sep. 16, 1988

Related U.S. Application Data

[63] Continuation-in-part of Ser. No. 7,833, Mar. 26, 1987, abandoned, and a continuation-in-part of Ser. No. 57,419, Jun. 3, 1987, abandoned.

[51] Int. Cl.[5] .................... H01L 23/48; H01L 29/44; H01L 29/52; H01L 29/60
[52] U.S. Cl. ........................................ 357/69; 357/71
[58] Field of Search ..................... 357/69, 71, 80, 81

[56]     References Cited
U.S. PATENT DOCUMENTS 4,480,013 10/1984 Doi et al. ............................ 428/616
4,546,406 10/1985 Spinelli et al. ..................... 361/386
4,698,663 10/1987 Sugimoto et al. .................... 357/81
4,742,024  5/1988 Sugimoto et al. .................... 357/81

OTHER PUBLICATIONS

Koharu, M. et al., "Thermal-Stress-Free Package for Flip Chip Devices", IEEE Transactions, CHMT-7, 34th ECC, May, 1984, pp. 388-393.

Primary Examiner—William L. Sikes
Assistant Examiner—Robert E. Wise
Attorney, Agent, or Firm—B. Peter Barndt; Mel Sharp; James T. Comfort

[57]              ABSTRACT

A substrate for mounting a flip-chip on a metallized circuit on the upper surface of the substrate. The substrate is silicon carbide condensed on a graphite or silicon core. The upper surface of the silicon carbide has a layer of insulating material comprised of silicon oxide, silicon nitride, aluminum nitride, boron nitride, an organic insulator such as polyimide, and diamond. The insulator prevents inadvertent shorting of the integrated circuit. The insulating layer can be deposited on the silicon carbide by such processes as chemical vapor deposition, sputtering, spinning or roller coating.

28 Claims, 5 Drawing Sheets

INSULATED SUBSTRATE FOR FLIP-CHIP INTEGRATED CIRCUIT DEVICE

This Application is a continuation-in-part of U.S. Pat. application Ser. No. 007,833, filed Jan. 26, 1987 and now abandoned; and is a continuation-in-part of U.S. Pat. application Ser. No. 057,419, filed June 3, 1987 and now abandoned; both assigned to Texas Instruments Incorporated. U.S. Pat. No. 3,436,306 and U.S. Pat. applications Ser. No. 007,833, filed Jan. 26, 1987 and Ser. No. 057,419, filed June 3, 1987, are hereby incorporated by reference.

BACKGROUND OF THE INVENTION

1. Field of the Invention

This invention relates to the fabrication of flip-chip integrated circuit devices, and more particularly, to a thermal expansion matching, low alpha particle emitter substrate having an insulated layer upon which to deposit metallized circuit patterns for making electrical contact with a flip-chip.

2. Description of the Related Art

Flip-chip technology involves plating metallized bumps on selected portions of the metallized pattern on the active face of a flip-chip, and mounting the flip-chip with its active face against a substrate. The bumps on the flip-chip may be reflow soldered to a metallized circuit pattern on the surface of the substrate. The metallized pattern on the substrate may be electrically connected to external circuitry by such means as the pin grid contactor described in the above-referred to U.S. Pat. application, Ser. No. 007,833, filed Jan. 26, 1987. Flip-chips are especially useful where a large number of electrical connections must be made with the integrated circuit, such as from two hundred to three hundred.

Because a flip-chip is mechanically locked to a substrate by the reflow solder joints between the flip-chip bumps and the substrate, the substrate material must have a coefficient of thermal expansion which closely matches that of the semiconductor material of which the integrated circuit is constructed. Otherwise, thermally generated shear forces between the flip-chip and the substrate can develop which are strong enough to damage the flip-chip or the substrate. In addition, the substrate material must have good thermal conductivity to prevent heat build-up in the integrated circuit chip, and must be inexpensive, durable, and readily processed for the addition and patterning of metallic conductors on its surface. An additional requirement is that, in the case of dynamic random access memory chips, or other semiconductor devices which are sensitive to soft errors caused by alpha particles, the substrate must not be an emitter of alpha particles. Also, the metallic conductors on the surface of the substrate must be on a dielectric surface to prevent inadvertent shorting of the integrated circuit.

In the case of flip-chips constructed of silicon, a suitable substrate material has been found in silicon carbide. Silicon carbide has a coefficient of thermal expansion closely matching that of silicon, it is inexpensive, and possesses sufficient mechanical strength to be used as a substrate. A shortcoming of silicon carbide, however, is that it is not a good enough insulator or dielectric to prevent inadvertent shorting or electrical interference of one flip-chip contact with another. It is desirable that the substrate resistivity be on the order of 100 tera-ohm-cm or more. Pure silicon carbide has a resistivity of approximately 1000 ohm-cm, which is far too low.

Prior art solutions to the resistivity problem have focused upon modifying the entire silicon carbide substrate by adding other ceramics to it, such as beryllium oxide, yttrium oxide, aluminum oxide, or silicon oxide, to achieve higher resistances. However, such modifications result in such adverse consequences as increased cost, increased toxicity due to the beryllium, and an adverse change in the dielectric constant of the modified silicon carbide. In addition, the coefficient of thermal expansion of the substrate can be adversely changed by such additions to the silicon carbide so that the coefficient for the substrate no longer closely matches that of silicon.

Modern VLSI integrated circuit chips have grown to such a size that it is not uncommon to find one requiring from two to three hundred electrical contacts to the external world. For every such contact, an external lead or pin is required to make electrical contact between the chip and external circuitry as may be found on a printed circuit board. For VLSI chips of this size, older package styles, such as DIP's, have proven to be inadequate since they would require an extremely large package size to accommodate the necessary number of pins or leads VLSI chips of this large size are often logic parts such as ECL gate arrays.

One of the answers to the problem of developing a very high pin count package is the pin grid array package style. Older package styles have pins or leads which protrude from one to four sides of a rectangular package. The pin grid array package typically is square and may have from one to several rows of pins protruding from the peripheral portions of its bottom surface. An example of such a pin grid array package 1 is shown in FIG. 1. The illustrated device has sixty pins 2 protruding from its bottom surface 3. These pins 2 are for insertion into a socket or plated through holes in a printed circuit board.

One of the present methods of electrically connecting an integrated circuit chip to the pins of a pin grid array is illustrated in FIG. 1. The integrated circuit chip 4 is mounted in the bottom surface 3 of the pin grid array package 1, and is connected to the pins 2 via bond pads 5, bond wires 6 and metallized leads 7. For simplicity, FIG. 1 shows only two such electrical connections. Experience has shown that the bond wire method of forming the electrical connections becomes very difficult with pin grid array packages having more than two hundred pins. This is due to the difficulty of forming the wire bonds in very close proximity to each other. A further disadvantage of wire bonding is that it is an expensive, labor intensive process, requiring costly machinery and materials such as gold wire, and requiring considerable human intervention. Furthermore, wire bonds are subject to breakage, for instance, during the packaging process.

There have been attempts to get larger pin counts from a pin grid array device by using flip-chips. Flip-chips have metallized bumps plated at contact points on the metallized circuit pattern which is on the face of the chip. The bumps at the contact points are for contact with external circuitry, and are used in lieu of wire bonds. The substrate for mounting the flip-chip has a metallized circuit pattern on its face and contact points for electrically contacting the bumps on the face of the flip-chip. Typically, the bumps are soldered to the contact points on the substrate. The metallized patterns on the surface of the substrate are in electrical contact with the pins of the completed integrated circuit device.

Flip-chips have been used in prior art pin grid array devices, however, they must be used in thermally stable environments since these prior art devices utilize flip-chips and substrates having dissimilar coefficients of thermal expansion. Large enough temperature variations cause such devices to develop shear forces between the flip-chip and substrate sufficiently large to cause damage to the device.

Not solved by the prior art is the problem of finding a suitable substrate possessing all the desired properties of a pin grid array device. That is, the substrate must have a high coefficient of thermal conductivity in order to dissipate the heat built up in the operating flip-chip; the substrate should have a coefficient of thermal expansion close to that of the semiconductor material of which the flip-chip is comprised in order to allow the assembled pin grid array device to be operated in a variety of ambient temperatures; the substrate must be mechanically rugged; and the substrate should allow the mounting of pins for making electrical contact between the assembled pin grid array device and external circuitry.

SUMMARY OF THE INVENTION

The invention provides a silicon carbide substrate on which to mount a flip-chip. The silicon carbide substrate includes an insulating layer on its surface for mounting metallized circuitry to prevent inadvertent shorting or interference of the various electrical contacts on the flip-chip. The insulating layer may be silicon oxide, silicon nitride, aluminum nitride, boron nitride or diamond. Organic compounds such as polyimides can also be used to form the insulating layer. Only the insulating layer is relied upon to provide the necessary dielectric surface for the metallized circuit patterns. Nothing is added to the silicon carbide itself to try to make it less conductive.

The insulating layer is sufficiently thin that it does not significantly affect the coefficient of thermal expansion of the substrate as a whole, nor does it significantly affect the thermal conductivity of the substrate. Insulating layers as described above are relatively inexpensive to form, do not emit alpha radiation, nor do they involve highly toxic materials such as beryllium.

DESCRIPTION OF THE PREFERRED EMBODIMENTS

Figure 5:
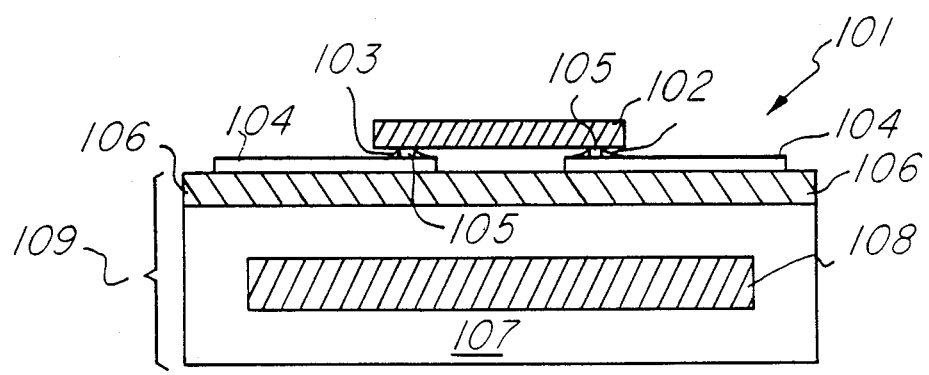
FIG. 5 is a side section of a flip-chip reflow soldered to a metallized circuit on the face of the substrate provided by the invention.

Turning to FIG. 5, an integrated circuit device 101 is illustrated having a silicon flip-chip 102 reflow soldered at joints 103 to metallized circuitry 104. The sold joints 103 bond the flip-chip bumps 105 to the metallized circuitry 104. The metallized circuitry 104 is disposed on the surface of the insulating layer 106 on the upper surface of the silicon carbide substrate 107. In the embodiment shown in FIG. 5, the silicon carbide has been deposited on a graphite core 108.

Silicon carbide can be vapor deposited on the graphite core 108 by evaporating methyltrichlorosilane into a chamber with hydrogen gas. The resulting condensation on the surface of the graphite core 108 is the silicon carbide 107. Instead of graphite, a silicon core can be used. Such a process of depositing silicon carbide is discussed in previously mentioned U.S Pat. No. 3,436,306. The graphite core 108 is a form of graphite having a coefficient of thermal expansion closely matching that of silicon and silicon carbide. Several graphites meeting this criterion are: "1507", made by Union Carbide; "6222", made by Stackpole; and "SIC6"or "SIC12", made by Toyotanso of Japan. Although the substrate as illustrated includes the graphite core 108, the core can be ground away leaving only the upper layer of silicon carbide and the insulating layer 106 as the substrate.

Silicon carbide has the necessary strength to function as a substrate, is very hard and has a very high flexure strength of approximately 86,000 PSI. As pointed out in U.S Pat. Nos. 3,436,306 and 3,873,824, silicon carbide and silicon have similar coefficients of thermal expansion. For purposes of this invention, when it is stated that a coefficient of thermal expansion is similar to silicon, closely matches silicon, or similar language, it is contemplated that such coefficient of thermal expansion falls within the range of from three times ten to the minus 6 to four times ten to the minus 6 inches per inch per degree centigrade. It is contemplated that for the embodiment of the invention having a silicon flip-chip, the flip-chip, the silicon carbide and the graphite all have coefficients of thermal expansion falling within this range.

The thickness of the insulating layer 106 is in the range of from 0.5 to 2.0 microns, so that the layer 106 is sufficiently thin so that it does not significantly affect the coefficient of thermal expansion of the layer 106, the silicon carbide 107, and the core 108 taken together as the substrate assembly 109. The insulating layer 106 is very much thinner than the layer of silicon carbide upon whose surface it has been deposited. Thus, the coefficient of thermal expansion of the substrate assembly 109 falls within the range of from three times ten to the minus 6 to four times ten to the minus 6 inches per inch per degree centigrade. In addition, the layer 106 is sufficiently thin so that it does not significantly diminish the thermal conductivity of the substrate assembly 109 which is very close to the high thermal conductivity of silicon carbide alone.

Two embodiments of the invention contemplate the deposition of polysilicon or epitaxial silicon on the silicon carbide 107 using a vapor process such as chemical vapor deposition (CVD) or other similar process presently in use in integrated circuit manufacture. This deposited layer of silicon can then be oxidized in a furnace such as those used in the industry to grow thermal silicon oxide. The resultant insulating layer 106 will be very low in alpha particle emissions. Since silicon carbide is more resistant to oxidation than silicon, the thickness of the insulating layer 106 is controlled by the thickness of the deposited silicon, which is in the range of from 0.5 to 2.0 microns thick. Silicon carbide resists oxidation which makes it very difficult to provide an oxidizing layer 106 by oxidizing the silicon carbide alone.

The insulating layer 106 can also be formed by sputtering onto the silicon carbide 107 from a target made of an insulator such as silicon oxide, silicon nitride, aluminum nitride, or boron nitride. By using targets with the purity specifications for integrated circuit manufacture, the sputtered insulating layer 106 will also have a low alpha particle impurity level.

Another embodiment of the invention involves the formation of insulating layer 106 by spinning or roller coating the silicon carbide 107 with an organic compound such as a polyimide.

The layer 106 can also be formed of diamond by microwave chemical vapor deposition.

As will be appreciated by those skilled in the art, the present invention can be widely modified and varied, and its scope is not limited except as specified in the allowed claims.

Depending on the packaging application, combinations of inorganic and organic dielectrics (insulators) can be used. These dielectrics can be metallized using conventional vacuum metallization techniques (e.g., sputtering, evaporation) and electrochemical metallization techniques (e.g., electroplating and electroless plating). Multi-layered patterns can be built utilizing such techniques, and are supported by the silicon carbide.

The invention is usable with a pin grid contactor which is a frame overlay with pins protruding from its upper surface for contacting external circuitry. The contactor also has contact points on its bottom surface for making electrical contact with metallized pads on a highly thermally conductive substrate to which is electrically connected a flip chip. The substrate, flip chip, and pin grid contactor frame all have similar coefficients of thermal expansion. The bumps on the face of the flip chip are first reflow soldered to the substrate using a high melting point solder, and then the pin grid contactor contact points are reflow soldered to the substrate using a lower melting point solder so that the flip chip does not become desoldered while soldering the pin grid contactor.

One embodiment of the invention comprehends a silicon flip chip, a ceramic pin grid contactor, and a substrate, all having similar coefficients of thermal expansion to prevent shear forces from developing during thermal cycling. The substrate of this embodiment is silicon carbide which is very strong mechanically, and is highly thermally conductive.

The present invention completely eliminates labor intensive wire bonding and the attendant costs and equipment.

The silicon carbide substrate of the invention is very hard and has a high flexure strength. At the same time, it is a very good conductor of heat, and has a coefficient of thermal expansion closely matching that of silicon.

The silicon carbide substrate, by its hardness, makes it a difficult material in which to mount the pins of the pin grid array device. However, the pin grid contactor solves the problem of mounting the pins by being constructed of ceramic which is amenable to having pins mounted in it.

The ceramic material of which the pin grid contactor is constructed has a coefficient of thermal expansion which closely matches that of the silicon flip chip.

Thus, the fully assembled pin grid array device of the invention is given mechanical ruggedness by the silicon carbide substrate; the substrate conducts heat away from the operating silicon flip chip; the pin grid array contactor provides the pin contact with circuitry in the outside world; and the silicon flip chip, substrate, and pin grid contactor all have similar coefficients of thermal expansion so that the device can be operated in an environment with changing ambient temperatures.

By using flip chips, the devices of the invention can achieve pin counts of at least five hundred, as opposed to the 200 to 300 limitation imposed by wire bonding.

Figure 2:
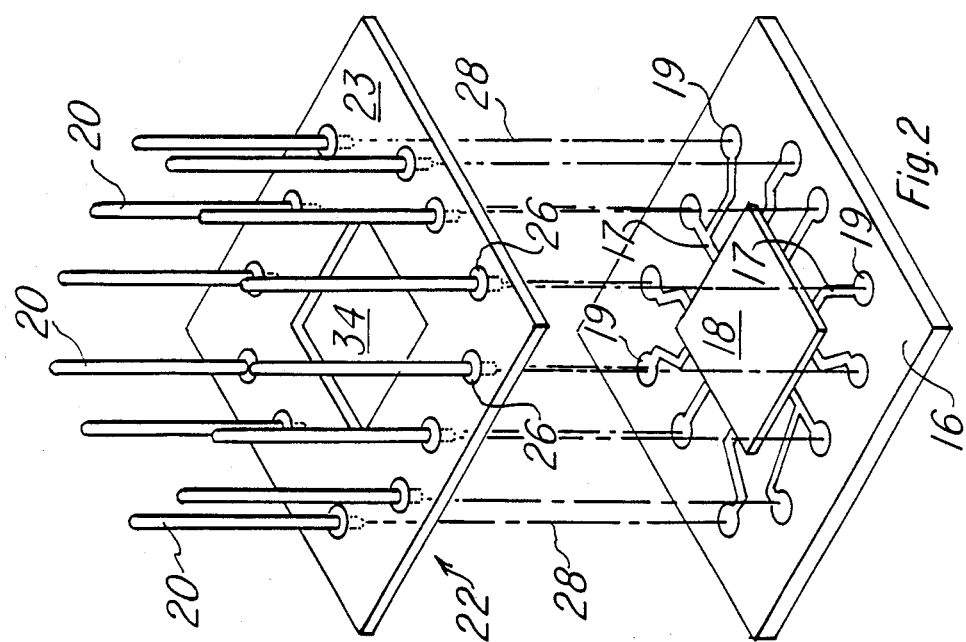
FIG. 2 is a perspective view of a flip chip and substrate, and the pin grid contactor of the invention.
Figure 1:
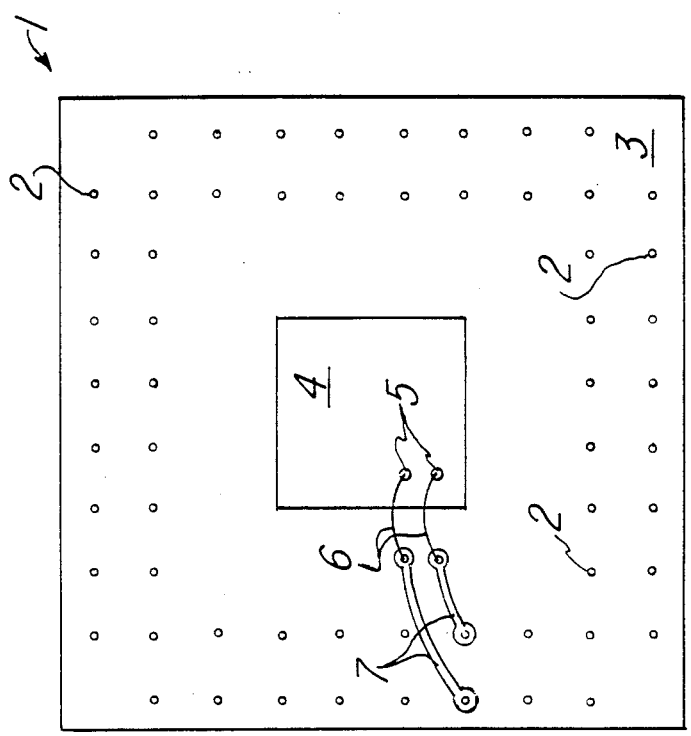
FIG. 1 is a bottom view of a prior art pin grid array package integrated circuit device in which the semiconductor chip is mounted in the underside of the package.
Figure 3:
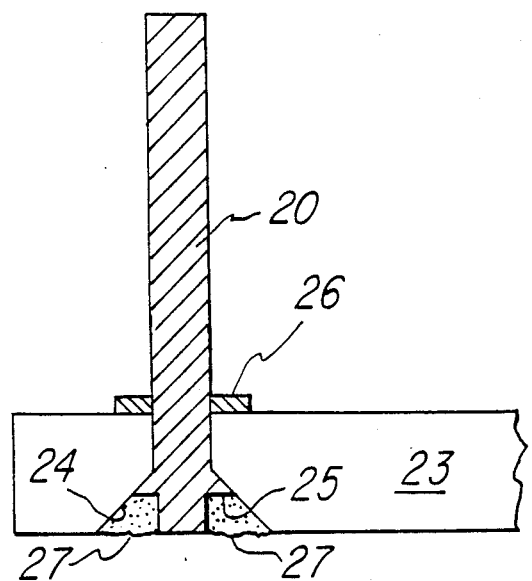
FIG. 3 is a sectional, edge view of a section of a pin grid contactor of the invention.
Figure 4:
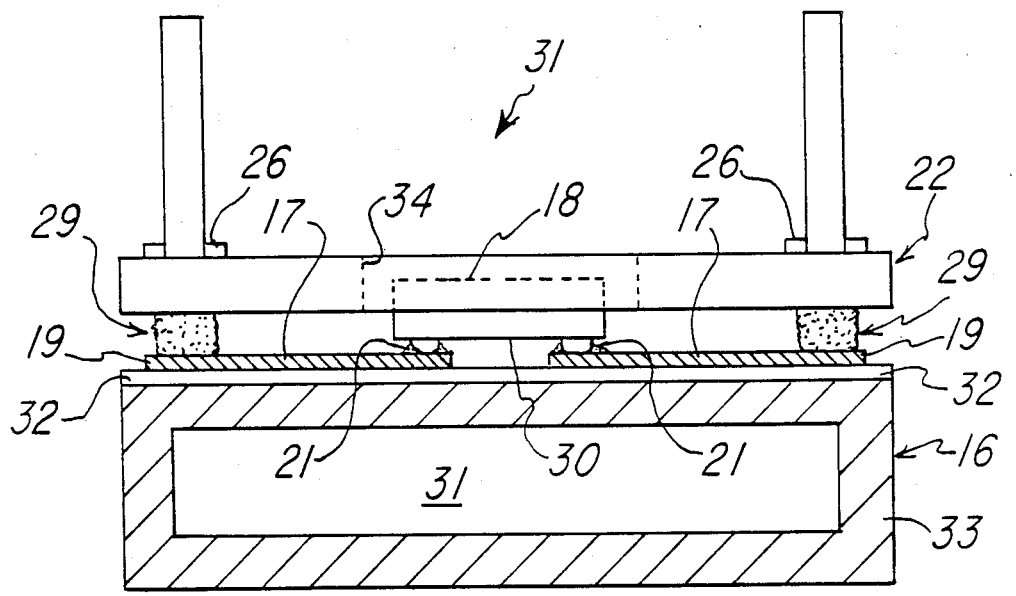
FIG. 4 is a sectional, edge view of a substrate with a flip chip and pin grid contactor soldered to the substrate.

FIG. 2 shows an embodiment of the pin grid contactor 22 having only twelve pins 20 for simplicity of illustration. The pins 20 are mounted in the pin grid contactor frame 23 so that they project from its upper surface, as seen in FIGS. 2 and 3. As can be seen from FIG. 2, the pin grid contactor frame 23 is a square, planar sheet of ceramic material having a square opening 34 centered in the frame 23. The square opening 34 is for accommodating the flip chip 18 within the opening 34, as can be seen in FIG. 4. The opening 34 allows the pin grid contactor to be positioned closer to the substrate than the height of the flip chip 18 would otherwise allow.

FIG. 3 shows that the pins 20 are inserted into a countersunk pin hole 24. The pins 20 are prevented from over insertion by a pin flange 25, and are prevented from being pushed back through the pin hole 24 by a pin collar 26 which is applied after the pins have been inserted into the pin holes. The pin collars 26 may be solder applied to the pins 20 at their point of exit from the pin hole 24. Alternatively, the pin collars 26 may be screened on metallization with solder or braze subsequently applied. The material of which the pins are made may be a copper alloy or any other standard material used for IC package pin construction.

Also shown in FIG. 3 is the pin solder contact 27 which is a low temperature solder having a melting point of approximately 183 degrees centigrade. Each pin has an associated pin solder contact disposed in the lower surface of the pin grid contactor frame. The pin solder contacts 27 are for establishing electrical and mechanically locked contact of the pins with the lead pads 19 as seen in FIGS. 2 and 4. This is accomplished by bringing the pin solder contacts 27 into contact with their associated lead pads 19 shown by the dotted lines 28 in FIG. 2, and then reflow soldering the pin solder contacts 27 to the pads 19. Electrical contact of the pins 20 with the integrated circuit on the flip chip 18, is established via the soldered connections 29, shown in FIG. 4, the metallized leads 17 on the surface of the substrate 16, and the plated bumps 21 on the metallized circuit pattern on the face 30 of the flip chip 18.

To form the flip chip pin grid array package 31, shown in FIG. 4, two reflow soldering processes have been performed. First, the plated bumps 21 of the flip chip 18 are reflow soldered to the leads 17 on the upper surface of the substrate 16 using high temperature solder having a melting point of approximately 295 degrees centigrade. Second, the pin grid contactor is placed upon the upper surface of the substrate 16 with the pin solder contacts 27 placed upon their associated lead pads 19 as indicated by the dotted lines 28 in FIG. 2. At this point the second reflow solder process is carried out to solder the pin solder contacts 27 to their associated lead pads 19, using low temperature solder (as mentioned previously) having a melting point of approximately 183 degrees centigrade.

The purpose of using a solder with a higher melting point for the first reflow soldering process is that the second reflow process will be carried out at a temperature too low to cause the solder joints formed in the first process to melt. Thus, the solder joints between the flip chip plated bumps 21 and the leads 17 on the substrate 16 will remain undisturbed by the second reflow process.

This invention can be used with flip chips made of any one of a variety of semiconductor materials. Of importance is that the flip chip 18, substrate 16, and pin grid contactor frame 23 all have similar coefficients of thermal expansion to prevent excessive shearing forces from developing at the solder joints between the flip chip and the substrate, and between the pin grid contactor and the substrate, during thermal cycling of the assembled flip chip pin grid array device. The shearing forces become excessive when they are sufficient to cause cracking or damage to the solder joints or other parts of the finished device. Also desirable is that the substrate be highly thermally conductive and be mechanically rugged.

One embodiment of the invention comprehends the use of silicon as the flip chip semiconductor material. In this case, the pin grid contactor frame 23 has been constructed of a commercially available ceramic material called "FC-01"which has a coefficient of thermal expansion clsoely matching that of silicon. "FC-01"is manufactured by NTK Technical Ceramics, whose parent company is NGK Spark Plug, Inc., U.S.A. Other ceramics which can be used are cordierite and mullite, or mixtures thereof, which are known to have coefficients of thermal expansion similar to that of silicon.

The substrate 16 illustrated in FIG. 4 is constructed to have a coefficient of thermal expansion close to that of silicon. The substrate core 31 is a form of graphite having a coefficient of thermal expansion close to that of silicon. Several graphites meeting this criterion are: "1507", made by Union Carbide; "6222", made by Stackpole; and "SIC6"or "SIC12", made by Toyotanso of Japan. The purpose of the substrate core 31 is to provide a surface for vapor depositing a silicon carbide layer 33. Silicon carbide is the preferred material of which to construct the substrate 16. Silicon carbide is very hard and has a very high flexure strength of approximately 86,000 PSI, which means that it provides a very rugged substrate for the finished flip chip pin grid array device. As mentioned in U.S. Pat. Nos. 3,436,306 and 3,873,824; silicon carbide and silicon have similar coefficients of thermal expansion.

For purposes of this invention, when it is said that a coefficient of thermal expansion is similar to silicon, closely matches silicon, or similar language, it is contemplated that such coefficient of thermal expansion falls in the range of from three times ten to the minus 6 to four times ten to the minus 6 inches per inch per degree centigrade. It is contemplated that for the embodiment of the invention utilizing a silicon flip chip, that the flip chip, the substrate, and the pin grid contactor frame all have coefficients of thermal expansion falling within this range.

Since silicon carbide is somewhat electrically conductive, a thin insulating or dielectric layer 32, such as silicon dioxide, is provided on the upper surface of the silicon carbide. The metallized leads 17 and lead pads 19 are then laid down on the upper surface of the insulating layer 32 of the substrate 16, as shown in FIGS. 2 and 4.

The silicon carbide layer 33 is vapor deposited on the graphite core 31 by evaporating methyltrichlorosilane into a chamber with hydrogen gas. The resulting condensation on the surface of the graphite core 31 is the silicon carbide layer 33. Such a process of forming silicon carbide is discussed in aforementioned U.S. Pat. No. 3,436,306; in which silicon carbide is deposited on a silicon substrate (rather than graphite as here). Although the substrate now includes the graphite core 31, the core could be ground away leaving only the upper layer of silicon carbide with the dielectric layer 32 as the substrate.

We claim:

1. A flip-chip substrate comprised of:
   a layer of silicon carbide;
   an insulating layer deposited on the upper surface of the silicon carbide layer, wherein the insulating layer is for supporting metallized circuitry to which a flip-chip can be attached, the insulating layer having a thickness substantially less than the thickness of the silicon carbide layer.

2. The substrate of claim 1 wherein the thickness of the silicon carbide layer is in the range 0.5 to 2.0 microns.

3. The substrate of claim 1 wherein the insulating layer is comprised of an oxide of silicon.

4. The substrate of claim 1 wherein the insulating layer is comprised of a material selected from the group comprising:
   silicon nitride;
   aluminum nitride; and
   boron nitride.

5. The substrate of claim 1 wherein the insulating layer is comprised of an organic compound.

6. The substrate of claim 5 wherein the organic compound is a polyimide.

7. The substrate of claim 1 wherein the insulating layer is comprised of diamond.

8. A flip-chip substrate having a coefficient of thermal expansion substantially equal to that of silicon, comprising:
   a layer of silicon carbide;
   an insulating layer deposited on the upper surface of the silicon carbide layer, wherein the insulating layer is for supporting circuitry, the insulating layer having a thickness substantially less than the thickness of the layer of silicon carbide.

9. The flip-chip substrate of claim 8 wherein the substrate is comprised of semiconductor grade materials.

10. The flip-chip substrate of claim 8 wherein the insulating layer is comprised of an oxide of silicon.

11. The flip-chip substrate of claim 10 wherein the oxide of silicon is formed by depositing a layer on the layer of silicon carbide, and oxidizing the deposited layer, the deposited layer comprised of a material from the group comprising polysilicon and epitaxial silicon.

12. The flip-chip substrate of claim 10 wherein the oxide of silicon is formed by sputtering onto the layer of silicon carbide from a target made of silicon oxide.

13. The flip-chip substrate of claim 8 wherein the insulating layer is comprised of a material selected from the group comprising:
   silicon nitride;
   aluminum nitride; and
   boron nitride.

14. The flip-chip substrate of claim 13 wherein the insulating layer is formed by sputtering.

15. The flip-chip substrate of claim 8 wherein the insulating layer is comprised of a polyimide.

16. The flip-chip substrate of claim 15 wherein the insulating layer is formed by spinning on the silicon carbide layer.

17. The flip-chip substrate of claim 15 wherein the insulating layer is formed by roller coating on the silicon carbide layer.

18. A flip-chip substrate having a coefficient of thermal expansion substantially equal to that of silicon, comprising:
 a core having a coefficient of thermal expansion substantially equal to that of silicon;
 a layer of silicon nitrade covering the core; and
 an insulating layer covering the upper surface of the silicon nitrade upon which circuitry can be disposed;
 wherein the core is comprised of a material from the group comprising graphite or silicon.

19. The substrate of claim 18 wherein the coefficient of thermal expansion of the substrate is in the range of from three times ten to the minus 6 to four times ten to the minus 6 inches per inch per degree centigrade.

20. The substrate of claim 18 wherein the insulating layer is comprised of a material selected from the group:
 an oxide of silicon;
 silicon nitride;
 aluminum nitride;
 boron nitride; and
 polyimide.

21. The substrate of claim 18 wherein the insulating layer is comprised of diamond.

22. The substrate of claim 18 wherein the layer of silicon nitride is deposited on the core by condensing the silicon nitride upon the core.

23. A method of fabricating a flip-chip substrate having a coefficient of thermal expansion substantially the same as that of silicon, comprising the steps of:
 depositing a layer on a silicon carbide layer, the deposited layer having a thickness substantially less than the thickness of the silicon carbide layer; and
 oxidizing the deposited layer in a furnace; wherein the deposited layer is comprised of a meterial taken from the group of polysilicon and epitaxial silicon.

24. A method of fabricating a flip-chip substrate having a coefficient of thermal expansion substantially the same as that of silicon, comprising the steps of:
 sputtering an insulating layer onto a layer of silicon carbide from a target selected from the group:
 silicon oxide;
 silicon nitride;
 aluminum nitride; and
 boron nitride.

25. A method of fabricating a flip-chip substrate having a coefficient of thermal expansion substantially the same as that of silicon, comprising the steps of:
 spinning a polyimide insulating layer upon a layer of silicon carbide.

26. A method of fabricating a flip-chip substrate having a coefficient of thermal expansion substantially the same as that of silicon, comprising the steps of:
 depositing an insulating layer of diamond on a silicon carbide layer by microwave chemical deposition.

27. The method of claims 23, 24, 25, or 26 further comprising the step of forming a layer of silicon nitride by condensing silicon nitride upon a core, the core being comprised of a material taken from the group comprising graphite and silicon.

28. A method of fabricating a flip-chip substrate having a coefficient of thermal expansion substantially the same as that of silicon, comprising the step of: roller coating a polyimide insulating layer upon a layer of silicon carbide.

* * * * *